(12) United States Patent
Su

(10) Patent No.: US 10,890,960 B2
(45) Date of Patent: Jan. 12, 2021

(54) METHOD AND APPARATUS FOR LIMITING RACK POWER CONSUMPTION

(71) Applicant: INSPUR ELECTRONIC INFORMATION INDUSTRY CO., LTD, Shandong (CN)

(72) Inventor: Xiao Su, Shandong (CN)

(73) Assignee: INSPUR ELECTRONIC INFORMATION INDUSTRY CO., LTD, Shandong (CN)

( * ) Notice: Subject to any disclaimer, the term of this patent is extended or adjusted under 35 U.S.C. 154(b) by 291 days.

(21) Appl. No.: 15/745,131

(22) PCT Filed: Dec. 13, 2016

(86) PCT No.: PCT/CN2016/109577
§ 371 (c)(1),
(2) Date: Jan. 15, 2018

(87) PCT Pub. No.: WO2018/040360
PCT Pub. Date: Mar. 8, 2018

(65) Prior Publication Data
US 2019/0018469 A1  Jan. 17, 2019

(30) Foreign Application Priority Data
Aug. 30, 2016  (CN) .......................... 2016 1 0767551

(51) Int. Cl.
*H04L 12/10* (2006.01)
*G06F 1/3203* (2019.01)
(Continued)

(52) U.S. Cl.
CPC .............. *G06F 1/3203* (2013.01); *G06F 1/32* (2013.01); *H04L 12/10* (2013.01); *H05K 7/1498* (2013.01)

(58) Field of Classification Search
CPC .............. G06F 1/32; G06F 9/44; H04L 12/10
See application file for complete search history.

(56) References Cited

U.S. PATENT DOCUMENTS 9,250,684 B1 * 2/2016 Chen ...................... G06F 1/3206
10,466,754 B2 * 11/2019 Eastep ................... G06F 1/3203
(Continued)

FOREIGN PATENT DOCUMENTS

CN  101277200 A  10/2008
CN  102387024 A   3/2012
(Continued)

OTHER PUBLICATIONS

International Search Report for PCT/CN2016/109577, dated May 27, 2017, ISA/CN.

*Primary Examiner* — Keshab R Pandey
(74) *Attorney, Agent, or Firm* — Yue (Robert) Xu; Apex Attorneys at Law, LLP

(57) ABSTRACT

A method and an apparatus for limiting rack power consumption are provided. The method includes: determining a rack power consumption limitation threshold; determining a current power consumption limitation mode; calculating a total power consumption limit for nodes in a rack; calculating a power consumption threshold for each of the nodes based on the current power consumption limitation mode, the rack power consumption limitation threshold and the total power consumption limit for the nodes in the rack; and transmitting the power consumption threshold for each of the nodes to the node, to enable the node to limit power consumption according to the received power consumption threshold.

6 Claims, 7 Drawing Sheets

(51) Int. Cl.
  *G06F 1/32* (2019.01)
  *H05K 7/14* (2006.01)

(56) References Cited

U.S. PATENT DOCUMENTS

| | | | |
|---|---|---|---|
| 2011/0126206 A1* | 5/2011 | Kato | G06F 1/206 |
| | | | 718/103 |
| 2013/0024713 A1* | 1/2013 | Bajic | G06F 1/324 |
| | | | 713/340 |
| 2013/0283068 A1 | 10/2013 | Li et al. | |
| 2014/0122910 A1 | 5/2014 | Chiu et al. | |
| 2015/0263525 A1* | 9/2015 | Fornage | H02J 3/14 |
| | | | 307/35 |

FOREIGN PATENT DOCUMENTS

| | | |
|---|---|---|
| CN | 102624546 A | 8/2012 |
| CN | 102916835 A | 2/2013 |
| CN | 103516537 A | 1/2014 |
| CN | 103777734 A | 5/2014 |
| CN | 105302276 A | 2/2016 |
| CN | 105357313 A | 2/2016 |
| EP | 2747344 A1 | 6/2014 |

* cited by examiner

METHOD AND APPARATUS FOR LIMITING RACK POWER CONSUMPTION

This application is a National Stage application of PCT international patent application PCT/CN2016/109577 filed on Dec. 13, 2016 which claims priority to Chinese Patent Application No. 201610767551X, titled "METHOD AND APPARATUS FOR LIMITING RACK POWER CONSUMPTION", filed with the Chinese Patent Office on Aug. 30, 2016, both of which are incorporated herein by reference in their entireties.

FIELD

The disclosure relates to the technical field of servers, and in particular to a method and an apparatus for limiting rack power consumption.

BACKGROUND

With the continuous development of the cloud computing technology, a rack in which a large number of nodes are deployed is increasingly favored by users. However, the large number of nodes are bound to increase the power consumption of the rack, resulting in excessive power consumption. Therefore, during use of the rack, rack power consumption limitation is also concerned.

Currently, the rack power consumption is reduced in the following manner. The user determines a power consumption limitation value for each of nodes in the rack, accesses each of the nodes in the rack and transmits the power consumption limitation value for the node to the node, thereby reducing the power consumption of the rack. However, due to a large number of racks and a large number of nodes in each rack, it takes substantial time for the user to access each of the nodes and transmit the power consumption limitation value for each of the nodes. Therefore, it is difficult to improve the efficiency of rack power consumption limitation during a process of limiting rack power consumption.

SUMMARY

According to embodiments of the present disclosure, a method and an apparatus for limiting rack power consumption are provided. With the method and the apparatus, the efficiency of rack power consumption limitation can be effectively improved.

In a first aspect, a method for limiting rack power consumption is provided according to an embodiment of the present disclosure, which includes:
determining a rack power consumption limitation threshold;
determining a current power consumption limitation mode;
calculating a total power consumption limit for nodes in a rack;
calculating a power consumption threshold for each of the nodes based on the current power consumption limitation mode, the rack power consumption limitation threshold and the total power consumption limit for the nodes in the rack; and
transmitting the power consumption threshold for each of the nodes to the node, to enable the node to limit power consumption according to the received power consumption threshold.

Preferably, the method may further include:
acquiring current switch power consumption, current fan-wall power consumption, and current power conversion efficiency loss power consumption, where
the total power consumption limit for the nodes in the rack may be calculated according to an equation:

$$p=(p_0-p_a-p_b-p_c)\times 98\% \quad (1),$$

where p represents the total power consumption limit for the nodes in the rack, $p_0$ represents the rack power consumption limitation threshold, $p_a$ represents the switch power consumption, $p_b$ represents the fan-wall power consumption, and $p_c$ represents the power conversion efficiency loss power consumption.

Preferably, the current power consumption limitation mode may be a dispatching mode; and the method may further include: acquiring a power consumption weight of each of the nodes, where
the power consumption threshold for each of the nodes may be calculated according to an equation:

$$p_i = x_i \times \frac{p}{\sum_{i=1}^{n} x_i}, \quad (2)$$

where $p_i$ represents a power consumption threshold for a node i, $x_i$ represents a power consumption weight of the node i, and n represents the number of the nodes in the rack.

Preferably, the current power consumption limitation mode may be a balancing mode, where
the power consumption threshold for each of the nodes may be calculated according to an equation:

$$p_i = \frac{p}{n}, \quad (3)$$

where $p_i$ represents a power consumption threshold for a node i, and n represents the number of the nodes in the rack.

In a second aspect, an apparatus for limiting rack power consumption is provided according to an embodiment of the present disclosure, which includes:
a determination unit configured to determine a rack power consumption limitation threshold and a current power consumption limitation mode;
a calculation unit configured to calculate a total power consumption limit for nodes in a rack based on the rack power consumption limitation threshold determined by the determination unit, and calculate a power consumption threshold for each of the nodes based on the current power consumption limitation mode and the rack power consumption limitation threshold determined by the determination unit and the total power consumption limit for the nodes in the rack; and
a transmission unit configured to transmit the power consumption threshold for each of the nodes calculated by the calculation unit to the node, to enable the node to limit power consumption according to the received power consumption threshold.

Preferably, the apparatus may further include:
a first acquisition unit configured to acquire current switch power consumption, current fan-wall power consumption, and current power conversion efficiency loss power consumption, where
the calculation unit may be configured to calculate the total power consumption limit for the nodes in the rack based on the current switch power consumption, the current fan-wall power consumption and the current power conversion efficiency loss power consumption acquired by the first acquisition unit, and the rack power consumption limitation threshold determined by the determination unit, according to an equation:

$$p = (p_0 - p_a - p_b - p_c) \times 98\% \quad (1),$$

where p represents the total power consumption limit for the nodes in the rack, $p_0$ represents the rack power consumption limitation threshold, $p_a$ represents the switch power consumption, $p_b$ represents the fan-wall power consumption, and $p_c$ represents the power conversion efficiency loss power consumption.

Preferably, the apparatus may further include:

a second acquisition unit configured to acquire a power consumption weight of each of the nodes, where the determination unit may be configured to determine the current power consumption limitation mode as a dispatching mode; and the calculation unit may be configured to calculate the power consumption threshold for each of the nodes based on the power consumption weight of the node acquired by the second acquisition unit, the dispatching mode determined by the determination unit, and the total power consumption limit for the nodes in the rack, according to an equation:

$$p_i = x_i \times \frac{p}{\sum_{i=1}^{n} x_i}, \quad (2)$$

where $p_i$ represents a power consumption threshold for a node i, $x_i$ represents a power consumption weight of the node i, and n represents the number of the nodes in the rack.

Preferably, the determination unit may be configured to determine the current power consumption limitation mode as a balancing mode; and the calculation unit may be configured to calculate the power consumption threshold for each of the nodes based on the balancing mode determined by the determination unit, and the total power consumption limit for the nodes in the rack, according to an equation:

$$p_i = \frac{p}{n}, \quad (3)$$

where $p_i$ represents the power consumption threshold for a node i, and n represents the number of the nodes in the rack.

A method and an apparatus for limiting rack power consumption are provided according to the embodiments of the present disclosure. By determining the rack power consumption limitation threshold, the current power consumption limitation mode and the total power consumption limit for the nodes in the rack, a rack management controller RMC is capable of automatically calculating the power consumption limitation threshold for each of the nodes in the rack using the calculation method in the current power consumption mode, and it is unnecessary for the user to determine the power consumption limitation value for each of the nodes. Then, the rack management controller RMC transmits the power consumption limitation threshold for each of the nodes to the node in the rack, to enable management software in each of the nodes to control the node to reduce power consumption, and it is also unnecessary for the user to access each of the nodes in the rack during the transmission process. Therefore, even in a case of a large number of racks and a large number of nodes in each rack, the rack power consumption limitation can be achieved rapidly, thereby improving the rack power consumption limitation efficiency.

BRIEF DESCRIPTION OF THE DRAWINGS

The drawings to be used in the description of the embodiments of the application or the conventional technology will be described briefly as follows, so that the technical solutions according to the embodiments of the present application or according to the conventional technology will become clearer. It is apparent that the drawings in the following description only illustrate some embodiments of the present application. For those skilled in the art, other drawings may be obtained according to these drawings without any creative work.

DETAILED DESCRIPTION OF THE EMBODIMENTS

In order that the objectives, technical solutions and advantages of the present disclosure can be clearer, the technical solutions according to the embodiments of the present application will be described clearly and completely as follows in conjunction with the drawings in the embodiments of the present disclosure. It is apparent that the described embodiments are only a few rather than all of the embodiments according to the present application. Any other embodiments obtained by those skilled in the art based on the embodiments in the present disclosure without any creative work fall in the scope of protection of the present disclosure.

Figure 1:
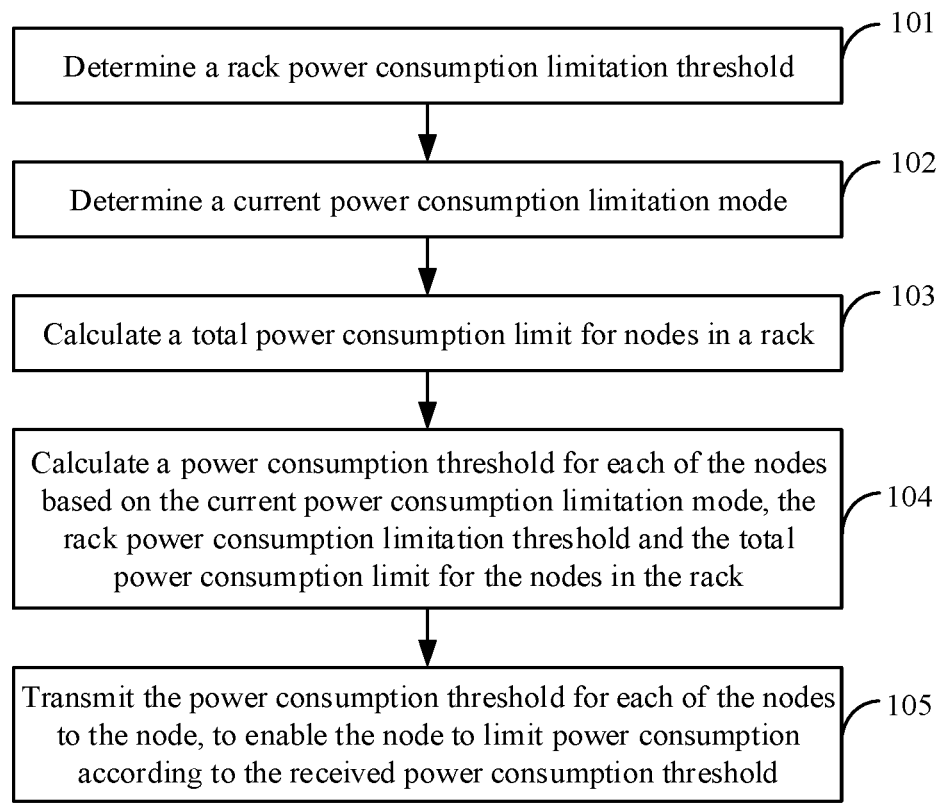
FIG. 1 illustrates a method for limiting rack power consumption according to an embodiment of the present disclosure.

As shown in FIG. 1, a method for limiting rack power consumption is provided according to an embodiment of the present disclosure. The method may include the following steps 101 to 105.

In step 101, a rack power consumption limitation threshold is determined.

In step 102, a current power consumption limitation mode is determined.

In step 103, a total power consumption limit for nodes in a rack is calculated.

In step 104, a power consumption threshold for each of the nodes is calculated based on the current power consumption limitation mode, the rack power consumption limitation threshold and the total power consumption limit for the nodes in the rack.

In step 105, the power consumption threshold for each of the nodes is transmitted to the node, to enable the node to limit power consumption according to the received power consumption threshold.

By determining the rack power consumption limitation threshold, the current power consumption limitation mode and the total power consumption limit for the nodes in the rack, a rack management controller RMC is capable of automatically calculating the power consumption limitation threshold for each of the nodes in the rack using the calculation method in the current power consumption mode, and it is unnecessary for the user to determine the power consumption limitation value for each of the nodes. Then, the rack management controller RMC transmits the power consumption limitation threshold for each of the nodes to the node in the rack, to enable management software in each of the nodes to control the node to reduce power consumption, and it is also unnecessary for the user to access each of the nodes in the rack during the transmission process. Therefore, even in a case of a large number of racks and a large number of nodes in each rack, the rack power consumption limitation can be achieved rapidly, thereby improving the rack power consumption limitation efficiency.

In an embodiment of the present disclosure, besides the large number of nodes in the rack, a fan-wall for heat dissipation for the nodes and the like may also cause significant power consumption. Therefore, in order to acquire an accurate total power consumption limit for the nodes in the rack, before step 103, the method may further include: acquiring current switch power consumption, current fan-wall power consumption, and current power conversion efficiency loss power consumption.

A specific implementation of step 103 includes:
calculating the total power consumption limit for the nodes in the rack using the following equation (1):

$$p = 98\% \, p_0 - p_a - p_b - p_c \qquad (1),$$

where p represents the total power consumption limit for the nodes in the rack, $p_0$ represents the rack power consumption limitation threshold, $p_a$ represents the switch power consumption, $p_b$ represents the fan-wall power consumption, and $p_c$ represents the power conversion efficiency loss power consumption.

In the embodiment of the present disclosure, the above three types of power consumption is most of the rack power consumption other than the power consumption of the nodes, and the three types of power consumption each can be acquired. For example, the fan-wall power consumption can be acquired using the rack management controller RMC. As another example, the switch power consumption can be acquired by accessing a unit storing power consumption values in a switch system. However, this does not exclude a case where power consumption of some components such as a memory in the rack cannot be acquired. This portion of power consumption does not exceed 2% of the total power consumption in the rack. Therefore, in order to ensure that an accurate total power consumption limit for the nodes in the rack can be acquired, in addition to the three types of current power consumption that can be acquired, 2% of power consumption that cannot be acquired should be subtracted from the rack power consumption limitation threshold, which is represented by the above multiplication by 98% in the calculation equation (1). In this way, accuracy of the total power consumption limit for the nodes in the rack can be ensured.

By acquiring current power consumption values of other components in the rack, the accurate total power consumption limit for the nodes in the rack can be calculated based on the determined rack power consumption threshold, thereby providing a basis for subsequently acquiring the accurate power consumption threshold for each of the nodes.

In an embodiment of the present disclosure, in order to satisfy the user requirement of setting different power consumption thresholds for the nodes, different power consumption limitation modes can be set in the rack. After the current power consumption limitation mode is determined as a dispatching mode in step 102, in order to satisfy the user requirement that power consumption thresholds are dynamically allocated to different nodes, the method may further include: acquiring a power consumption weight of each of the nodes before step 104.

A specific implementation of step 104 includes:
calculating the power consumption threshold for each of the nodes using the following equation (2):

$$p_i = x_i \times \frac{p}{\sum_{i=1}^{n} x_i}, \qquad (2)$$

where $p_i$ represents a power consumption threshold for a node i, $x_i$ represents a power consumption weight of the node i, and n represents the number of the nodes in the rack.

Power consumption of the nodes in the rack varies depending on services processed by the nodes. For example, the services may be classified into calculation, storage, interaction and the like. Generally, power consumption generated by a node for calculation or interaction is greater than that generated by a node for storage. In the embodiment of the present disclosure, a case where the number of nodes in the rack n is equal to 3 and the total power consumption limit for the nodes is 1200 w is taken as an example. A node 1 is used for calculation, a node 2 is used for storage, and a node 3 is used for interaction. First, power consumption weights of the node 1, the node 2 and the node 3 are respectively acquired according to power consumption standards of calculation, storage and interaction. For example, the acquired power consumption weight of the node 1 is 3, the acquired power consumption weight of the node 2 is 1, and the acquired power consumption weight of the node 3 is 2, then a total power consumption weight of nodes in the rack is $\Sigma_{i=1}^{3}$ 3+1+2=6. By using the above calculation equation (2), the power consumption threshold for the node 1 in the rack is $$p_1 = 3 \times \frac{1200}{6} = 600 \text{ w},$$

the power consumption threshold for the node 2 in the rack is $$p_2 = 1 \times \frac{1200}{6} = 200 \text{ w},$$

and the power consumption threshold for the node 2 in the rack is $$p_3 = 2 \times \frac{1200}{6} = 400 \text{ w}.$$

For a rack containing a large number of nodes, the power consumption threshold for each of the nodes in the rack can be calculated in this manner, which is not described herein.

The power consumption weight corresponding to each of the nodes can be acquired based on different services processed by different nodes, thereby dynamically allocating the power consumption thresholds for the nodes.

In an embodiment of the present disclosure, in order to satisfy different requirements on node power consumption limitation from different users, after the current power consumption limitation mode is determined as a balancing mode in step 102, a specific implementation of step 104 includes:

calculating the power consumption threshold for each of the nodes using the following equation (3):

$$p_i = \frac{p}{n}, \quad (3)$$

where $p_i$ represents a power consumption threshold for a node i, and n represents the number of the nodes in the rack.

In a case that the current power consumption limitation mode is determined as the balancing mode, it is unnecessary to acquire the power consumption weight of each of the nodes. Instead, only the number of nodes in the rack is to be determined. A case where the predetermined total power consumption limit for the nodes is 6000 w, and the number of nodes in the rack n is equal to 30 is taken as an example. By using the above equation (3), the power consumption threshold for each of the nodes in the rack can be calculated, which is $$\frac{6000}{30} = 200 \text{ w}.$$

Then the power consumption threshold 200 w for each node is transmitted to each of the 30 nodes by the rack management controller RMC, such that a management engine in each of the 30 nodes reduces the power consumption of the node, thereby achieving rack power consumption limitation.

It is to be noted that, power consumption limitation thresholds for the nodes in the rack may be different during different time periods. For example, during a certain time period, if the requirement on the computing capability of the node is low, a corresponding power consumption threshold is increased. In a next time period, if the requirement on the computing capability of the node is high, a corresponding power consumption threshold needs to be reduced, otherwise the data processing capability of the node may be affected. Therefore, in a case that the predetermined power consumption limitation mode is the dispatching mode, an adjustment time period for the rack power consumption limitation threshold may be preset, and the adjustment time period may be set according to data processing capabilities of nodes during different time periods. In this case, the system continuously refreshes time and determines whether a new rack power consumption limitation threshold is received when detecting that the adjustment time period is exceeded. In a case that no new rack power consumption limitation threshold is received, the current power consumption limitation mode may be switched to the above-described balancing node for ensuring the processing capabilities of nodes while reducing the rack power consumption, thereby conservatively reducing the rack power consumption to a certain degree.

In a case that there are a large number of racks and a few types of services processed by nodes in the racks, the efficiency of rack power consumption limitation can be more improved, and the rack power consumption can be effectively reduced by calculating the power consumption limitation thresholds for the nodes by the rack management controller RMC in the balancing mode.

In the following, the method for limiting rack power consumption according to the embodiments of the present disclosure is described in detail by taking cases where the rack power consumption is limited in two power consumption limitation modes as examples. For example, the two power consumption limitation modes are the dispatching mode and the balancing mode.

Figure 2:
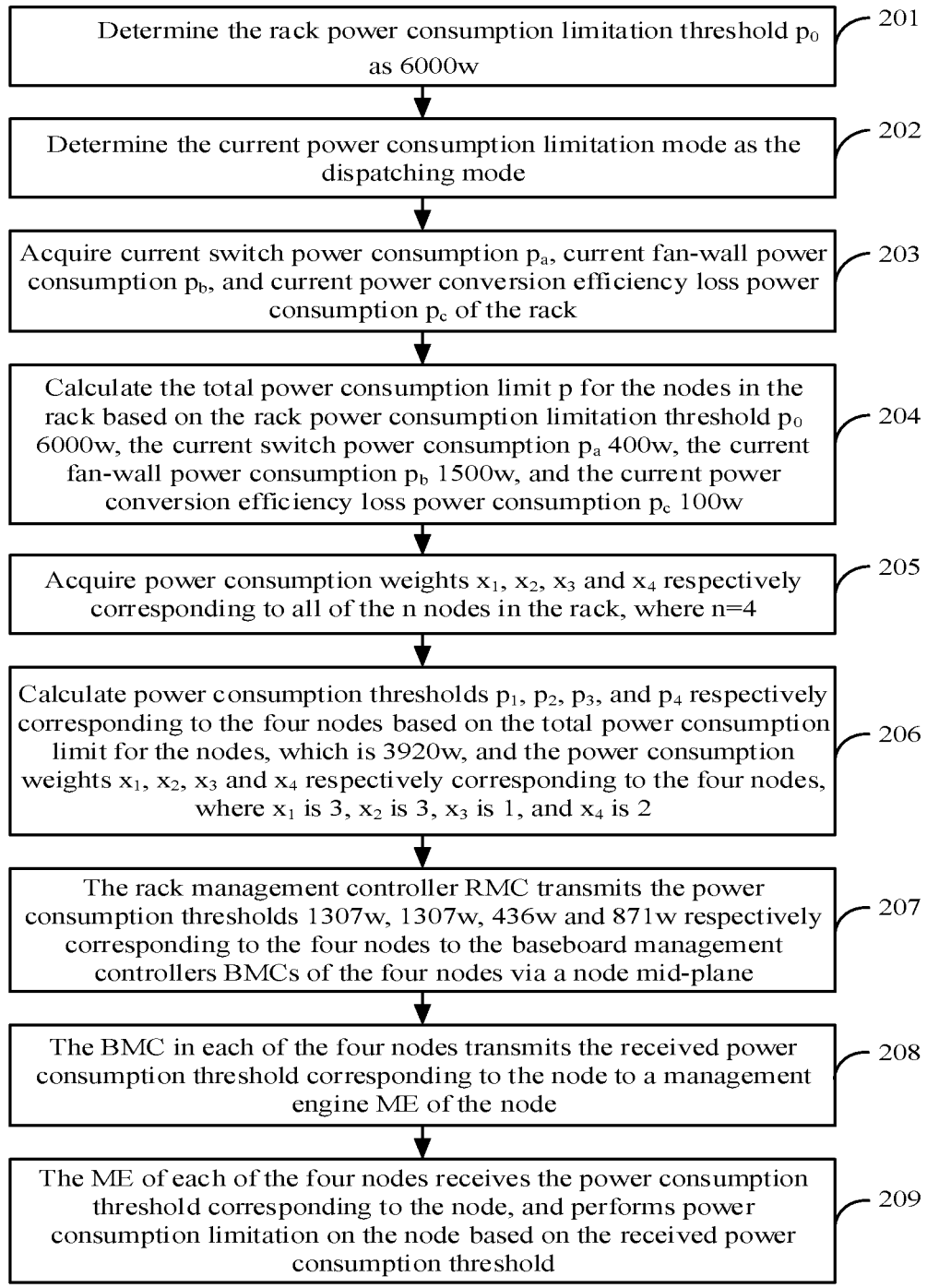
FIG. 2 illustrates a method for limiting rack power consumption according to another embodiment of the present disclosure.

In the following, by taking a case where the power consumption limitation mode is the dispatching mode, and the rack power consumption limitation threshold is 6000 w as an example, the method for limiting rack power consumption according to the embodiments of the present disclosure is described in detail. As shown in FIG. 2, the method may include the following steps 201 to 209.

In step 201, the rack power consumption limitation threshold $p_0$ is determined as 6000 w.

In order that it is unnecessary for the user to determine the power consumption thresholds for nodes in the rack one by one, the power consumption threshold for each of the nodes can be calculated by determining one rack power consumption limitation threshold, thereby improving the efficiency of acquiring the thresholds for nodes. In the embodiment of the present disclosure, in order to determine the rack power consumption limitation threshold $p_0$, a current rack power consumption threshold may be acquired first, since the degree of rack power consumption limitation cannot be determined without knowing the current rack power consumption threshold. For example, in a case that the current rack power consumption threshold is 6400 w, the rack power consumption threshold can be determined based on the current rack power consumption threshold 6400 w and a corresponding rack power consumption reduction standard. In the embodiment of the present disclosure, a case where the rack power consumption limitation threshold $p_0$ is 6000 w is taken as an example.

In step 202, the current power consumption limitation mode is determined as the dispatching mode.

In the dispatching mode according to the embodiment of the present disclosure, a power consumption threshold may be allocated dynamically to each of the nodes in the rack. Therefore, a calculation method and a corresponding instruction are preset for the dispatching mode. For example, the calculation method is set as a, and the instruction is set as b. In a case that the instruction b inputted by a user is received by the rack management controller RMC, which indicates that the user selects the dispatching mode as the current power consumption limitation mode to perform power consumption limitation on the rack, the rack management controller RMC performs corresponding calculations based on the received $p_0$ 6000 w and the calculation method a.

In step 203, current switch power consumption $p_a$, current fan-wall power consumption $p_b$, and current power conversion efficiency loss power consumption $p_c$ of the rack are acquired.

In the embodiment of the present disclosure, besides the nodes, some necessary components such as a switch, a fan-wall and a power supply are also deployed in the rack. In the case of the fan-wall, for example, two 3×4 fan units are deployed at the back of the rack, for dissipating heat from the nodes in the rack. Therefore, it is undeniable that this fan-wall is also a main source of rack power consumption. In the embodiment of the present disclosure, the rack power consumption limitation is implemented by performing power consumption limitation on each of the nodes in the rack. Therefore, it is necessary to acquire power consumption values of other sources of power consumption in the rack, such as the current power consumption value of the fan-wall, which is acquired and stored by the rack management controller RMC. In this embodiment, the acquired current switch power consumption $p_a$, the acquired current fan-wall power consumption $p_b$, and the acquired current power conversion efficiency loss power consumption $p_c$ of the rack are 400 w, 1500 w and 100 w, respectively.

In step 204, the total power consumption limit p for the nodes in the rack is calculated based on the rack power consumption limitation threshold $p_0$ 6000 w, the current switch power consumption $p_a$ 400 w, the current fan-wall power consumption $p_b$ 1500 w, and the current power conversion efficiency loss power consumption $p_c$ 100 w.

In the embodiment of the present disclosure, the total power consumption limit p for the nodes in the rack can be acquired using the calculation equation (1). The acquired rack power consumption limitation threshold $p_0$=6000 w, the current switch power consumption $p_a$=400 w, the current fan-wall power consumption $p_b$=1500 w, and the current power conversion efficiency loss power consumption $p_c$=100 w are substituted into the equation (1), thereby acquiring the total power consumption limit for the nodes p=6000×98%−400−1500−100=3880 w.

In step 205, power consumption weights $x_1$, $x_2$, $x_3$ and $x_4$ respectively corresponding to all of the n nodes in the rack are acquired, where n=4.

According to the dispatching mode in the embodiment of the present disclosure, power consumption thresholds are dynamically allocated according to different services processed by nodes. For example, among four nodes in the rack, a node 1 and a node 2 are used for processing calculation, a node 3 is used for storing processing data, instructions and the like, and a node 4 is used for data interaction with other nodes. Therefore, nodes for processing different services may be different in terms of power consumption. Generally, the node 1 and the node 2 for processing calculation services consume more power than the node 3 for storage. In the embodiment of the present disclosure, a case where the acquired power consumption weights $x_1$ and $x_2$, respectively corresponding to the node 1 and the node 2, equal to 3, the power consumption weight $x_3$ corresponding to the node 3 equals to 1, and the power consumption weight $x_4$ corresponding to the node 4 equals to 2 is taken as an example.

In step 206, power consumption thresholds $p_1$, $p_2$, $p_3$, and $p_4$ respectively corresponding to the four nodes are calculated based on the total power consumption limit p for the nodes, which is 3880 w, and the power consumption weights $x_1$, $x_2$, $x_3$ and $x_4$ respectively corresponding to the four nodes, where $x_1$ is 3, $x_2$ is 3, $x_3$ is 1, and $x_4$ is 2.

In the embodiment of the present disclosure, when the power consumption weights respectively corresponding to the four nodes in the rack are acquired, the power consumption thresholds respectively corresponding to the four nodes can be calculated according to the calculation equation (2) corresponding to the case where the power consumption mode is the dispatching mode. The power consumption weight $x_1$ corresponding to the node 1 is substituted into the calculation equation (2), where $x_1$=3. The power consumption threshold $p_1$ for the node 1 can be acquired, where $$p_1 = x_1 \times \frac{3880}{\sum_{i=1}^{4} x_i} = 3 \times \frac{3880}{3+3+1+2} = 3 \times \frac{3880}{9} = 1293 \text{ w}.$$

Since the power consumption weights of the node 2 and the node 1 are the same, which are 3, the power consumption threshold $p_2$ for the node 2 is also 1293 w. Likewise, the power consumption weight $x_3$ corresponding to the node 3 is substituted into the calculation equation (2), where $x_1$=1. The power consumption threshold $p_3$ for the node 3 in the rack can be acquired, where $$p_3 = x_3 \times \frac{3880}{\sum_{i=1}^{4} x_i} = 1 \times \frac{3880}{3+3+1+2} = 1 \times \frac{3880}{9} = 431 \text{ w}.$$

The power consumption weight $x_4$ corresponding to the node 4 is substituted into the calculation equation (2), where $x_4$=2. The power consumption threshold $p_4$ for the node 4 can be acquired, where $$p_4 = x_4 \times \frac{3880}{\sum_{i=1}^{4} x_i} = 2 \times \frac{3880}{3+3+1+2} = 2 \times \frac{3880}{9} = 862 \text{ w}.$$

Accordingly, the power consumption thresholds respectively corresponding to the four nodes in the rack are acquired.

In step 207, the rack management controller RMC transmits the power consumption thresholds 1293 w, 1293 w, 431 w and 862 w respectively corresponding to the four nodes to baseboard management controllers BMCs of the four nodes via a node mid-plane.

In the embodiment of the present disclosure, the node mid-plane first receives the power consumption thresholds 1293 w, 1293 w, 431 w and 862 w corresponding to the four nodes transmitted from the rack management controller RMC, and respectively transmits the four power consumption thresholds to the baseboard management controllers BMCs of the four nodes. The BMC is an independent control chip.

In step 208, the BMC in each of the four nodes transmits the received power consumption threshold corresponding to the node to a management engine ME of the node.

In step 209, the ME of each of the four nodes receives the power consumption threshold corresponding to the node, and performs power consumption limitation on the node based on the received power consumption threshold.

In the embodiment of the present disclosure, the ME of the node performs power consumption limitation by reducing a frequency of a CPU in the node. For example, in the case of the node 1, on receipt of the power consumption limitation threshold 1293 w corresponding to the node 1, the ME in the node 1 analyzes and processes the power consumption limitation threshold 1293 w, and changes the frequency of the CPU in the node 1 to a frequency corresponding to 1293 w based on a result of the analysis and processing, thereby limiting the power consumption of the node 1 in the rack. The power consumption limitation on the node 2, the node 3 and the node 4 is performed based on the same principle as described above, and is not repeated here. In this way, the rack power consumption limitation is implemented.

Figure 3:
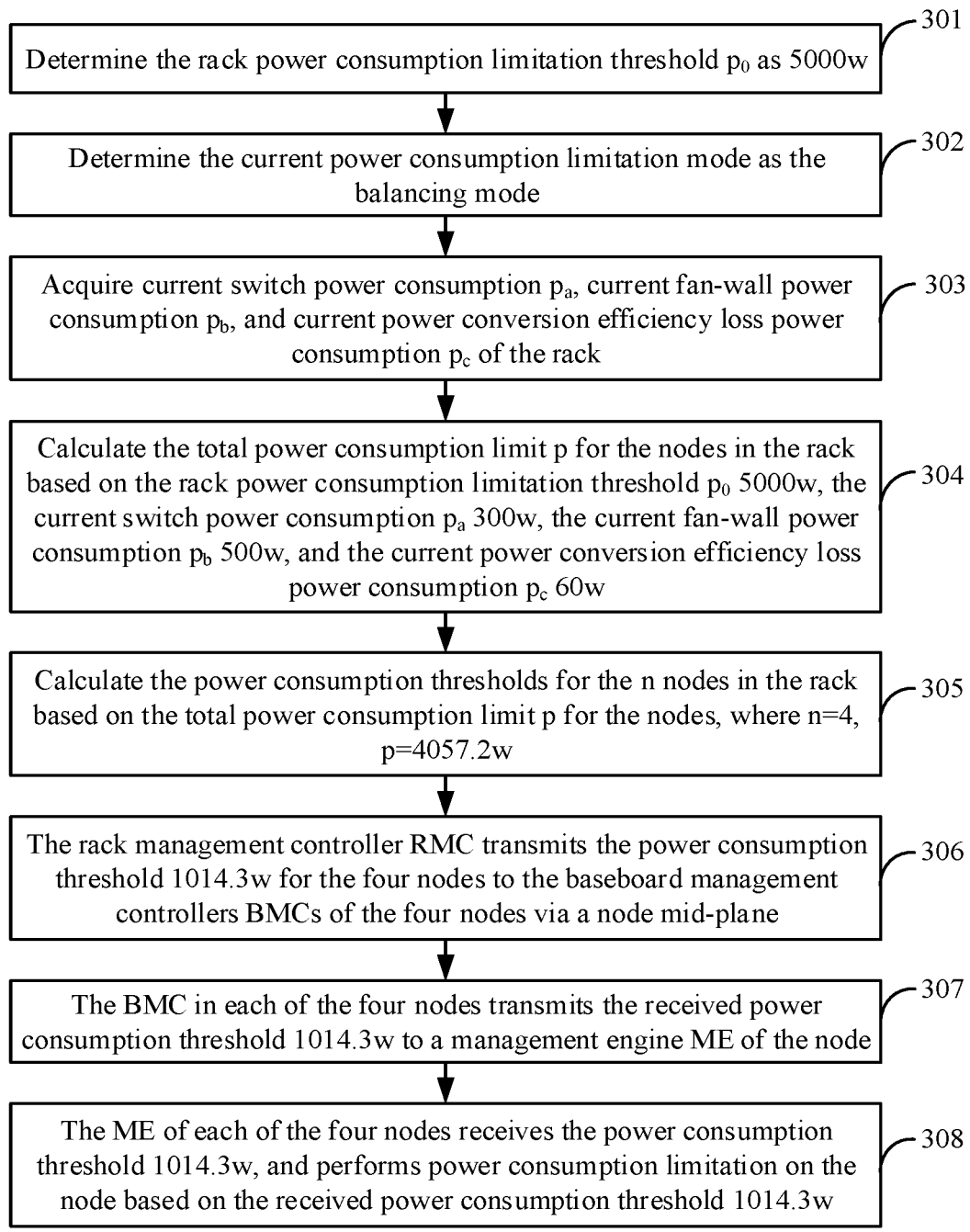
FIG. 3 illustrates a method for limiting rack power consumption according to another embodiment of the present disclosure.

In the following, by taking a case where the power consumption limitation mode is the balancing mode, and the rack power consumption limitation threshold is 5000 w as an example, the method for limiting rack power consumption according to the embodiments of the present disclosure is described in detail. As shown in FIG. 3, the method may include the following steps 301 to 308.

In step 301, the rack power consumption limitation threshold $p_0$ is determined as 5000 w.

In step 302, the current power consumption limitation mode is determined as the balancing mode.

The balancing mode in the embodiment of the present disclosure indicates that an average power consumption limitation threshold is allocated to all nodes in the rack. In a case that the rack management controller RMC does not receive a power consumption limitation mode instruction inputted by the user, the rack management controller RMC performs a computation rule c corresponding to the balancing mode by default, and acquires the power consumption threshold for each node based on the rack power consumption limitation threshold 5000 w.

In step 303, current switch power consumption $p_a$, current fan-wall power consumption $p_b$, and current power conversion efficiency loss power consumption $p_c$ of the rack are required.

In the embodiment of the present disclosure, a case where the current switch power consumption $p_a$, the current fan-wall power consumption $p_b$, and the current power conversion efficiency loss power consumption $p_c$ of the rack are 300 w, 500 w and 60 w respectively is taken as an example.

In step 304, the total power consumption limit p for the nodes in the rack is calculated based on the rack power consumption limitation threshold $p_0$ 5000 w, the current switch power consumption $p_a$ 300 w, the current fan-wall power consumption $p_b$ 500 w, and the current power conversion efficiency loss power consumption $p_c$ 60 w.

In the embodiment of the present disclosure, the total power consumption limit p for the nodes in the rack can be acquired using the calculation equation (1). The acquired rack power consumption limitation threshold $p_0$=5000 w, the current switch power consumption $p_a$=300 w, the current fan-wall power consumption $p_b$=500 w, and the current power conversion efficiency loss power consumption $p_c$=60 w are substituted into the equation (1), thereby acquiring the total power consumption limit for the nodes p=5000×98%−300−500−60=4040 w.

In step 305, the power consumption thresholds for the n nodes in the rack are calculated based on the total power consumption limit p for the nodes, where n=4, p=4040 w.

In the case of the balancing mode according to the embodiment of the present disclosure, in order to acquire the power consumption threshold for each node, after the total power consumption limit p for the nodes is calculated as 4040 w, p=4040 w and n=4 are substituted into the calculation equation (3), i.e., $$p_i = \frac{p}{n},$$

thereby acquiring the power consumption thresholds for the four nodes in the rack $$p_1 = p_2 = p_3 = p_4 = \frac{p}{n} = \frac{4040}{4} = 1010 \text{ w}.$$

In step 306, the rack management controller RMC transmits the power consumption threshold 1010 w for the four nodes to the baseboard management controllers BMCs of the four nodes via a node mid-plane.

In step 307, the BMC in each of the four nodes transmits the received power consumption threshold 1010 w to a management engine ME of the node.

In step 308, the ME of each of the four nodes receives the power consumption threshold 1010 w, and performs power consumption limitation on the node based on the received power consumption threshold 1010 w.

Figure 4:
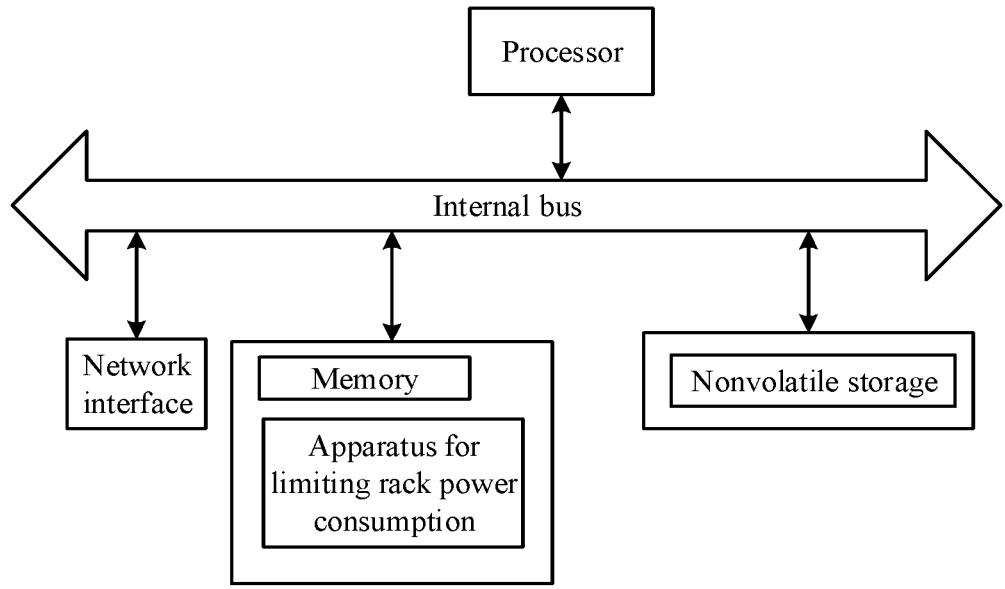
FIG. 4 is a schematic diagram illustrating a hardware architecture of a device in which an apparatus according to an embodiment of the present disclosure is provided.
Figure 5:
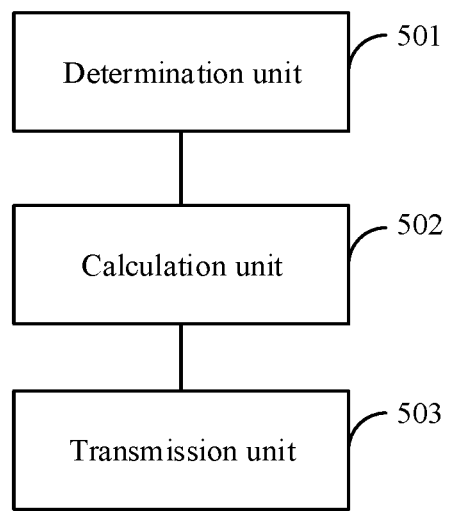
FIG. 5 illustrates an apparatus for limiting rack power consumption according to an embodiment of the present disclosure.

As shown in FIG. 4 and FIG. 5, an apparatus for limiting rack power consumption is provided according to an embodiment of the present disclosure. The apparatus embodiment may be implemented by software, or may be implemented by hardware or hardware in combination with software. The hardware implementation is as shown in FIG. 4, which is a schematic diagram illustrating a hardware architecture of a device in which the apparatus for limiting rack power consumption according to the embodiment of the present disclosure is provided. Besides a processor, a memory, a network interface and a nonvolatile storage shown in FIG. 4, generally, the device in which the apparatus according to the embodiment is provided may further include other hardware, such as a forwarding chip responsible for processing messages. The software implementation is taken as an example, as shown in FIG. 5, a logical apparatus is formed by reading computer program instructions in the non-volatile storage into the memory for running by the CPU of the device where the logical apparatus is located. An apparatus for limiting rack power consumption is provided according to this embodiment.

Referring to FIG. 5, an apparatus for limiting rack power consumption includes:

a determination unit 501, a calculation unit 502 and a transmission unit 503.

The determination unit 501 is configured to determine a rack power consumption limitation threshold and a current power consumption limitation mode.

The calculation unit 502 is configured to calculate a total power consumption limit for nodes in a rack based on the rack power consumption limitation threshold determined by the determination unit 501, and calculate a power consumption threshold for each of the nodes based on the current power consumption limitation mode and the rack power consumption limitation threshold determined by the determination unit 501 and the total power consumption limit for the nodes in the rack.

The transmission unit 503 is configured to transmit the power consumption threshold for each of the nodes calculated by the calculation unit 502 to the node, to enable the node to limit power consumption according to the received power consumption threshold.

Figure 6:
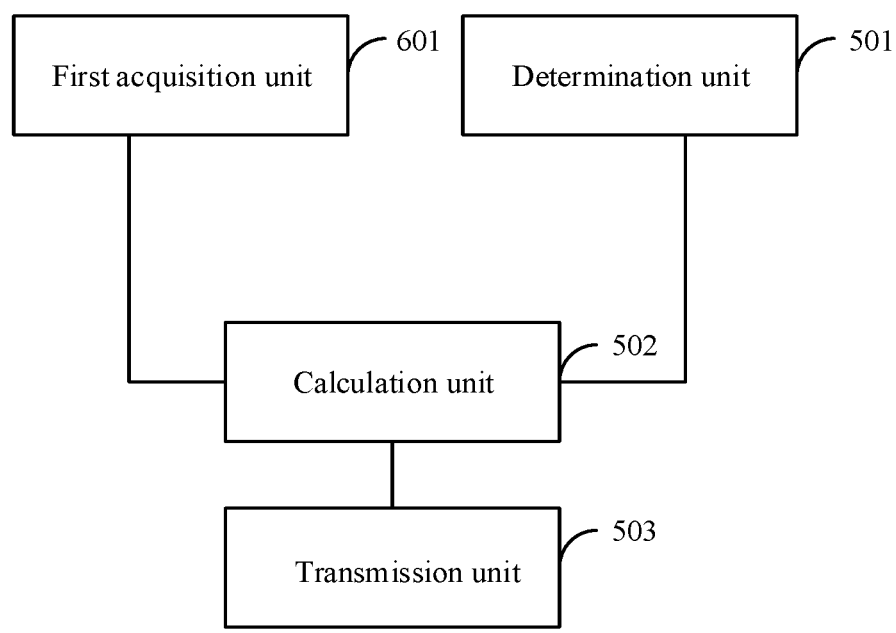
FIG. 6 illustrates an apparatus for limiting rack power consumption according to another embodiment of the present disclosure.

In an embodiment of the present disclosure, in order to acquire an accurate total power consumption limit for the nodes in the rack, the apparatus for limiting rack power consumption according to an embodiment of the present disclosure further includes a first acquisition unit 601, as shown in FIG. 6.

The first acquisition unit 601 is configured to acquire current switch power consumption, current fan-wall power consumption, and current power conversion efficiency loss power consumption.

The calculation unit 502 is configured to calculate the total power consumption limit for the nodes in the rack based on the current switch power consumption, the current fan-wall power consumption, and the current power conversion efficiency loss power consumption acquired by the first acquisition unit 601, and the rack power consumption limitation threshold determined by the determination unit 501, according to the following equation (1):

$$p=98\% \ p_0 - p_a - p_b - p_c \qquad (1),$$

where p represents the total power consumption limit for the nodes in the rack, $p_0$ represents the rack power consumption limitation threshold, $p_a$ represents the switch power consumption, $p_b$ represents the fan-wall power consumption, and $p_c$ represents the power conversion efficiency loss power consumption.

Figure 7:
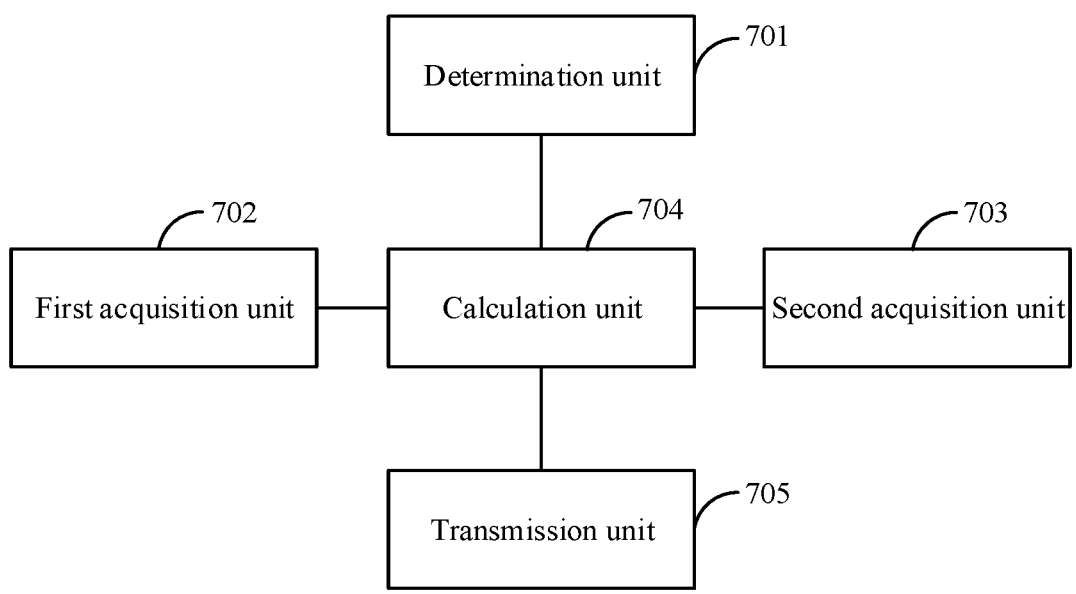
FIG. 7 illustrates an apparatus for limiting rack power consumption according to another embodiment of the present disclosure.

In an embodiment of the present disclosure, the current power consumption limitation mode may be a dispatching mode. Referring to FIG. 7, in this case, an apparatus for limiting rack power consumption includes:

a determination unit 701, a first acquisition unit 702, a second acquisition unit 703, a calculation unit 704 and a transmission unit 705.

The determination unit 701 is configured to determine a rack power consumption limitation threshold, and determine a current power consumption limitation mode as a dispatching mode.

The first acquisition unit 702 is configured to acquire current switch power consumption, current fan-wall power consumption, and current power conversion efficiency loss power consumption.

The second acquisition unit 703 is configured to acquire a power consumption weight of each of the nodes.

The calculation unit 704 is configured to calculate a total power consumption limit for the nodes in a rack based on the rack power consumption limitation threshold determined by the determination unit 701, and the current switch power consumption, the current fan-wall power consumption and the current power conversion efficiency loss power consumption acquired by the first acquisition unit 702; and calculate a power consumption threshold for each of the nodes based on the total power consumption limit for the nodes in the rack, the rack power consumption limitation threshold and the current dispatching mode determined by the determination unit 701 and the power consumption weight of the node acquired by the second acquisition unit 703, according to the following equation (2):

$$p_i = x_i \times \frac{p}{\sum_{i=1}^{n} x_i}, \qquad (2)$$

where $p_i$ represents a power consumption threshold for a node i, $x_i$ represents a power consumption weight of the node i, and n represents the number of the nodes in the rack.

The transmission unit 705 is configured to transmit the power consumption threshold for each of the nodes calculated by the calculation unit 704 to the node, to enable the node to limit power consumption according to the received power consumption threshold.

Figure 8:
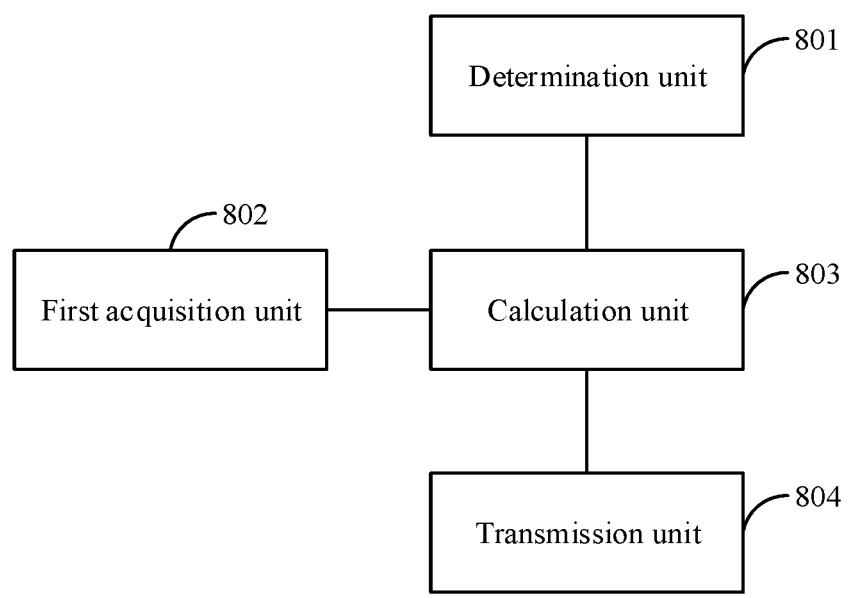
FIG. 8 illustrates an apparatus for limiting rack power consumption according to another embodiment of the present disclosure.

In an embodiment of the present disclosure, the current power consumption limitation mode may be a balancing mode. Referring to FIG. 8, in this case, an apparatus for limiting rack power consumption includes:

a determination unit 801, a first acquisition unit 802, a calculation unit 803 and a transmission unit 804.

The determination unit 801 is configured to determine a rack power consumption limitation threshold, and determine the current power consumption limitation mode as a balancing mode.

The first acquisition unit 802 is configured to acquire current switch power consumption, current fan-wall power consumption, and current power conversion efficiency loss power consumption.

The calculation unit 803 is configured to calculate a power consumption threshold for each of the nodes based on the rack power consumption limitation threshold and the current balancing mode determined by the determination unit 801, and the current switch power consumption, the current fan-wall power consumption and the current power conversion efficiency loss power consumption acquired by the first acquisition unit 802, according to the following equation (3):

$$p_i = \frac{p}{n}, \qquad (3)$$

where $p_i$ represents a power consumption threshold for a node i, and n represents the number of the nodes in the rack.

The transmission unit 804 is configured to transmit the power consumption threshold for each of the nodes calculated by the calculation unit 803 to the node, to enable the node to limit power consumption according to the received power consumption threshold.

In summary, the embodiments of the present disclosure have at least the following beneficial effects.

1. In the embodiment of the present disclosure, by determining the rack power consumption limitation threshold, the current power consumption limitation mode and the total power consumption limit for the nodes in the rack, a rack management controller RMC is capable of automatically calculating the power consumption limitation threshold for each of the nodes in the rack using the calculation method in the current power consumption mode, and it is unnecessary for the user to determine the power consumption limitation value for each of the nodes. Then, the rack management controller RMC transmits the power consumption limitation threshold for each of the nodes to the node in the rack, to enable management software in each of the nodes to control the node to reduce power consumption, and it is also unnecessary for the user to access each of the nodes in the rack during the transmission process. Therefore, even in a case of a large number of racks and a large number of nodes in each rack, the rack power consumption limitation can be achieved rapidly, thereby improving the rack power consumption limitation efficiency.

2. In the embodiment of the present disclosure, by acquiring current power consumption values of other components in the rack, the accurate total power consumption limit for the nodes in the rack can be calculated based on the determined rack power consumption limitation threshold, thereby providing a basis for subsequently acquiring the accurate power consumption threshold for each of the nodes.

3. In the embodiment of the present disclosure, the power consumption weight corresponding to each of the nodes can be acquired based on different services processed by different nodes, thereby dynamically allocating the power consumption thresholds for the nodes.

4. In the embodiment of the present disclosure, in a case that there are a large number of racks and a few types of services processed by nodes in the racks, the efficiency of rack power consumption limitation can be more improved, and the rack power consumption can be effectively reduced by calculating the power consumption limitation thresholds for the nodes by the rack management controller RMC in the balancing mode.

The information interaction, the execution process and the like between the units within the apparatus are based on the same concept as the method embodiment of the present disclosure, and for the detailed description, one may refer to the description in the method embodiments of the present disclosure and the detail description is not repeated here.

It should be noted that the relationship terminologies such as "first", "second" and the like are only used herein to distinguish one entity or operation from another, rather than to necessitate or imply that the actual relationship or order exists between the entities or operations. Furthermore, terms of "include", "comprise" or any other variants are intended to be non-exclusive. Therefore, a process, method, article or device including a plurality of elements includes not only the elements but also other elements that are not enumerated, or also include the elements inherent for the process, method, article or device. Unless expressively limited otherwise, the statement "comprising (including) one . . . " does not exclude the case that other similar elements may exist in the process, method, article or device.

Those skilled in the art should understand that all of or a part of steps of the above method embodiments may be performed by instructing corresponding hardware through a program. The proceeding program may be stored in a computer readable storage medium. When being executed, the program performs the steps of the above method embodiments. The proceeding storage medium includes various mediums capable of storing program codes, such as a ROM, an RAM, a magnetic disc or an optic disc.

It is to be noted that the foregoing are only preferred embodiments of the present disclosure and are merely illustrative of the technical solutions of the present disclosure without limiting the scope of protection of the present disclosure. Any modifications, equivalent substitutions, improvements, and the like within the spirit and principles of the present disclosure are intended to be included within the scope of protection of the present disclosure.

The invention claimed is:

1. A method for limiting rack power consumption, comprising:
    determining a rack power consumption limitation threshold;
    determining a current power consumption limitation mode;
    acquiring current switch power consumption, current fan-wall power consumption, and current power conversion efficiency loss power consumption;
    calculating a total power consumption limit for nodes in a rack based on the current switch power consumption, the current fan-wall power consumption, the current power conversion efficiency loss power consumption and the rack power consumption limitation threshold according to an equation p=98% $p_0-p_a-p_b-p_c$, wherein p represents the total power consumption limit for the nodes in the rack, $p_0$ represents the rack power consumption limitation threshold, $p_a$ represents the switch power consumption, $p_b$ represents the fan-wall power consumption, and $p_c$ represents the power conversion efficiency loss power consumption;
    calculating a power consumption threshold for each of the nodes based on the current power consumption limitation mode, the rack power consumption limitation threshold and the total power consumption limit for the nodes in the rack; and
    transmitting the power consumption threshold for each of the nodes to the each of the nodes, to enable the each of the nodes to limit power consumption according to the received power consumption threshold.

2. The method according to claim 1, wherein the current power consumption limitation mode is a dispatching mode;
    the method further comprises: acquiring a power consumption weight of each of the nodes; and
    the power consumption threshold for each of the nodes is calculated according to an equation:

$$p_i = x_i \times \frac{p}{\sum_{i=1}^{n} x_i},$$

where $p_i$ represents a power consumption threshold for a node i, $x_i$ represents a power consumption weight of the node i, and n represents the number of the nodes in the rack.

3. The method according to claim 1, wherein the current power consumption limitation mode is a balancing mode; and
    the power consumption threshold for each of the nodes is calculated according to an equation:

$$p_i = \frac{p}{n},$$

where $p_i$ represents a power consumption threshold for a node i, and n represents the number of the nodes in the rack.

4. An apparatus for limiting rack power consumption, comprising a processor and a non-volatile storage storing instructions that, when executed by the processor, cause the processor to:
    determine a rack power consumption limitation threshold and a current power consumption limitation mode;
    acquire current switch power consumption, current fan-wall power consumption, and current power conversion efficiency loss power consumption;
    calculate a total power consumption limit for nodes in a rack based on the current switch power consumption, the current fan-wall power consumption, the current power conversion efficiency loss power consumption and the rack power consumption limitation threshold according to an equation p=98% $p_0-p_a-p_b-p_c$, wherein p represents the total power consumption limit for the nodes in the rack, $p_0$ represents the rack power consumption limitation threshold, $p_a$ represents the switch power consumption, $p_b$ represents the fan-wall power consumption, and $p_c$ represents the power conversion efficiency loss power consumption;
    calculate a power consumption threshold for each of the nodes based on the current power consumption limitation mode and the rack power consumption limitation threshold and the total power consumption limit for the nodes in the rack; and transmit the power consumption threshold for each of the nodes to the each of the nodes, to enable the each of the nodes to limit power consumption according to the received power consumption threshold.

5. The apparatus according to claim 4, wherein the instructions that, when executed by the processor, cause the processor to:

acquire a power consumption weight of each of the nodes, determine the current power consumption limitation mode as a dispatching mode; and calculate the power consumption threshold for each of the nodes based on the power consumption weight of the node, the dispatching mode, and the total power consumption limit for the nodes in the rack, according to an equation:

$$p_i = x_i \times \frac{p}{\sum_{i=1}^{n} x_i},$$

where $p_i$ represents a power consumption threshold for a node i, $x_i$ represents a power consumption weight of the node i, and n represents the number of the nodes in the rack.

6. The apparatus according to claim 4, wherein the instructions that, when executed by the processor, cause the processor to:

determine the current power consumption limitation mode as a balancing mode; and calculate the power consumption threshold for each of the nodes based on the balancing mode, and the total power consumption limit for the nodes in the rack, according to an equation:

$$p_i = \frac{p}{n},$$

where $p_i$ represents a power consumption threshold for a node i, and n represents the number of the nodes in the rack.

* * * * *